United States Patent [19]

Stewart

[11] 4,216,390

[45] Aug. 5, 1980

[54] LEVEL SHIFT CIRCUIT

[75] Inventor: Roger G. Stewart, Neshanic Station, N.J.

[73] Assignee: RCA Corporation, New York, N.Y.

[21] Appl. No.: 948,509

[22] Filed: Oct. 4, 1978

[51] Int. Cl.² .................. H03K 5/02; H03K 3/353; H03K 17/10

[52] U.S. Cl. .................. 307/264; 307/270; 307/279; 307/DIG. 1

[58] Field of Search .............. 307/205, 251, 264, 270, 307/DIG. 1, 279

[56] References Cited

U.S. PATENT DOCUMENTS

| | | | |
|---|---|---|---|
| 3,675,144 | 7/1972 | Zuk | 307/251 X |
| 3,728,556 | 4/1973 | Arnell | 307/251 |
| 3,755,690 | 8/1973 | Smith | 307/DIG. 1 X |
| 3,823,330 | 7/1974 | Rapp | 307/DIG. 1 X |
| 3,906,254 | 9/1975 | Lane et al. | 307/205 |
| 4,000,412 | 12/1976 | Rosenthal et al. | 307/DIG. 1 X |
| 4,006,491 | 2/1977 | Alaspa et al. | 307/DIG. 1 X |
| 4,023,050 | 5/1977 | Fox et al. | 307/DIG. 1 X |
| 4,039,862 | 8/1977 | Dingwall et al. | 307/251 X |
| 4,080,539 | 3/1978 | Stewart | 307/270 X |
| 4,109,163 | 8/1978 | Cricchi et al. | 307/DIG. 1 X |

Primary Examiner—Larry N. Anagnos
Attorney, Agent, or Firm—H. Christoffersen; Henry I. Schanzer

[57] ABSTRACT

A gating means, biased to pass current only during signal transitions, transfers binary signals from an input signal source to a latch circuit when the signal source and the latch are operated at similar voltages. Following data transfer, the operating voltage across the latch is increased. The voltage levels of the latch output signals are correspondingly increased but the state to which the latch was set is maintained and there is no steady state current conduction through the gating means.

10 Claims, 4 Drawing Figures

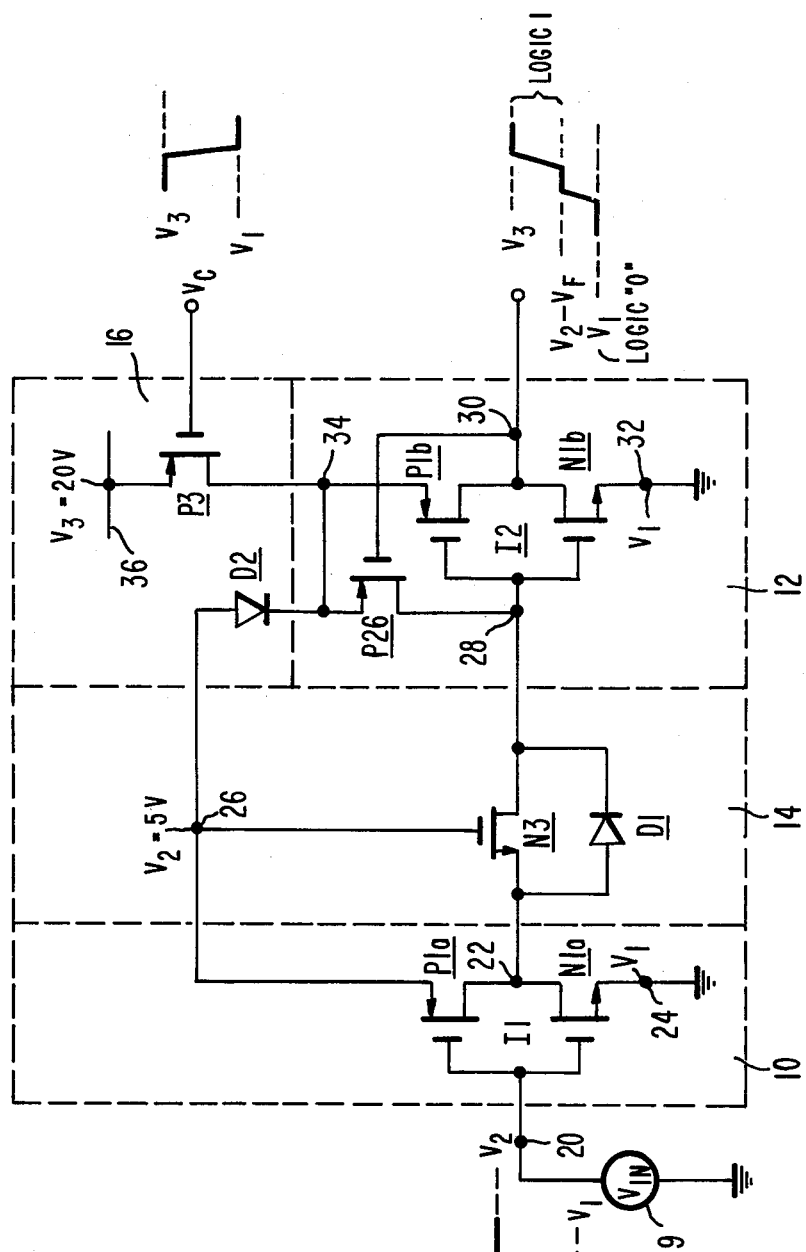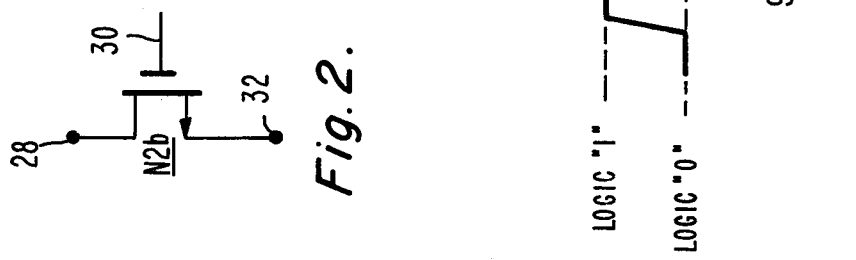

LEVEL SHIFT CIRCUIT

This invention relates to level shift circuits.

It is often necessary and/or desirable to operate different parts of an electronic system at different voltage levels. At the places where the different parts interface, they must be coupled to each other. However, the signals at the interfaces are not necessarily compatible. It is, therefore, necessary to provide interface and level shift circuits which can render one part of the system compatible with the other. For an interface or level shift circuit to be useful it must be compatible with the other circuits of the system with respect, among other things, to speed of operation, and minimization of power dissipation.

In circuits embodying the invention, signals are transferred from an input means to a full or half latch circuit via a gating means when the input means and the latch circuit are operated at the same or similar voltages. Following the data transfer the operating voltage across the latch is increased with the latch being maintained in the state to which it was set.

The invention is best understood and explained with reference to the accompanying drawings in which like reference characters denote like components, in which enhancement mode insulated-gate field-effect transistors (IGFETs) are used to illustrate the invention and in which IGFETs of P-conductivity type are identified by the letter P followed by a reference numeral, and IGFETs of N-conductivity type are identified by the letter N-followed by a reference numeral; and in which FIG. 1 is a schematic diagram of a level shift circuit embodying the invention;

FIG. 2 illustrates a circuit modification to convert the half latch 12 of FIG. 1 into a full latch;

Figure 3:
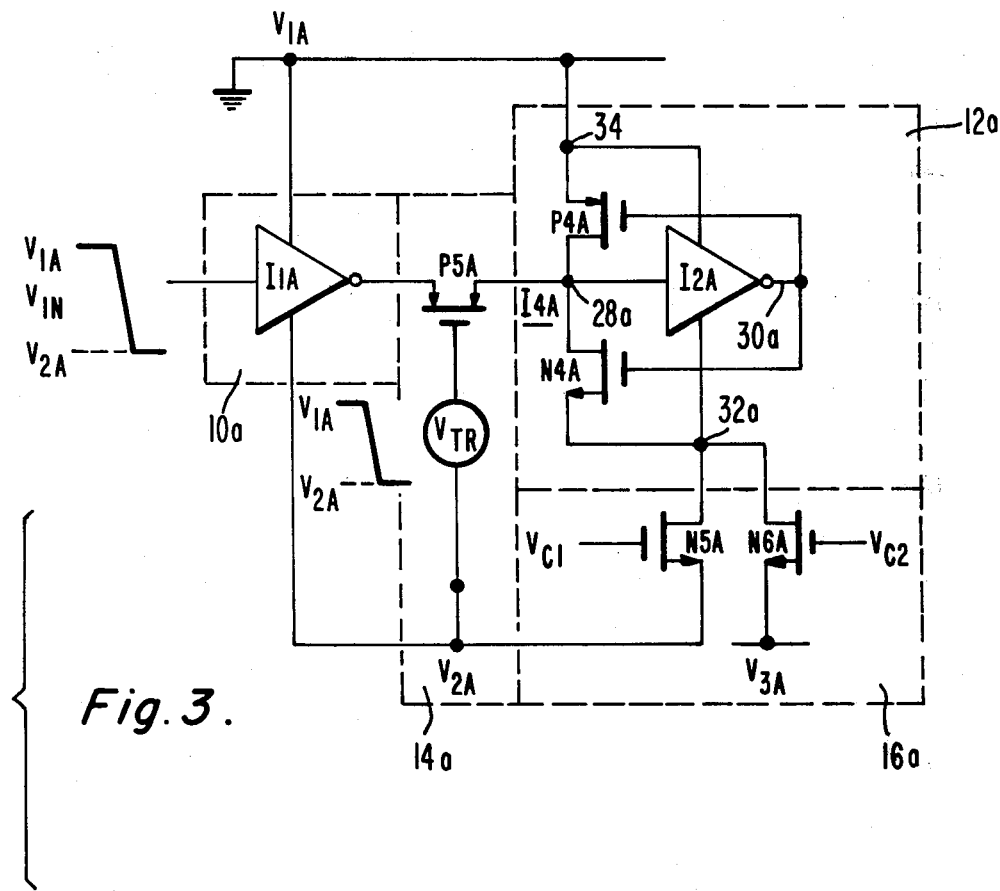
FIG. 3 is a schematic diagram of another level shift circuit embodying the invention.

The circuit of FIG. 1 includes an input signal translating circuit 10, a half-latch circuit 12, a gating network 14 for passing signals between the input circuit 10 and the latch 12, and a control circuit 16 for selectively changing the operating potential applied to latch 12.

The input circuit 10 includes a complementary inverter I1 comprised of IGFETs P1a and N1a connected at their gates to an input node 20 and at their drains to output node 22. The source of transistor N1a is connected to a first power terminal 24 to which is applied an operating voltage $V_1$ which, by way of example, is equal to zero volts (ground potential). The source of transistor P1a is connected to a second power terminal 26 to which is applied an operating voltage $V_2$ which, by way of example, is equal to 5 volts. A source 9 connected to node 20 generates input signals varying in amplitude between $V_1$ and $V_2$ volts. Output signals which are the complement, or inverse, of the input signals and which vary in amplitude between $V_1$ and $V_2$ volts are produced at the output 22 of inverter I1.

Half-latch 12 has a signal input node 28, a signal output node 30, a power terminal 32 to which is applied the ground potential ($V_1$), and a second power terminal 34 whose operating voltage is varied. Latch 12 includes a complementary inverter I2 comprising of IGFETs P1b and N1b connected at their gates to input node 28, and at their drains to output node 30. The sources of N1b and P1b are connected to terminals 32 and 34, respectively. Latch 12 also includes an IGFET P2b connected at its gate to node 30, at is source to terminal 34 and at its drain to node 28 to provide positive feedback when the output of inverter I2 is at, or goes close to, $V_1$ volts. The "ON" impedance of the conduction path of feedback IGFET P2b is preferably greater than the "ON" impedance of the conduction paths of the other IGFETs in the circuit.

The operating voltage applied to terminal 34 is varied by means of a diode D2 and an IGFET P3. Diode D2 connected between nodes 26 and 34 is poled so that $V_2$ volts less the $V_F$ drop of D2 is applied to node 34. Diode D2 may be replaced by a transistor switch whereby substantially all of $V_2$ is applied to node 34 when the transistor switch is turned on. IGFET P3 has its source-to-drain path connected between node 34 and a power terminal 36 to which is applied a third operating voltage $V_3$ which, by way of example, is 20 volts. The gate of P3 is connected to a control voltage, $V_C$, which is switched between $V_3$ and $V_1$ volts. When $V_C$ is at $V_1$, P3 is turned-on and $V_3$ volts are then applied to node 34. Diode D2 is then reverse biased isolating the $V_2$ and $V_3$ voltage sources. When $V_C$ is at $V_3$, P3 is turned-off and $V_2$ volts are coupled to node 34 via D2.

Gating network 14 includes an IGFET N3 having its conduction path connected between nodes 22 and 28 and its gate electrode connected to terminal 26. A diode D1 is also connected between nodes 22 and 28 poled to conduct current from node 22 into node 28.

In the operation of the circuit of FIG. 1 signal transfer between input circuit 10 and latch 12 occurs when both are operated at the same or similar potentials. That is, $V_2$ volts is applied to node 26 and $V_2 - V_F$ is applied to node 34. Following the transfer of information the operating potential applied to latch 12 is increased by turning on P3. The transfer of information (logic "0" or logic "1") from input node 20 into latch 12 is now described.

An input signal of zero ($V_1$) volts, defined arbitrarily as logic "0", applied to terminal 20 turns off N1a and turns-on P1a which conducts in the common wource mode clamping node 22 to terminal 26 thereby applying $V_2$ volts to node 22. N3 with $V_2$ volts applied to its gate and to its drain (the one of its two electrodes connected to node 22) conducts in the source follower mode charging node 28 towards $V_2$ volts. In addition, diode D1 conducts in parallel with N3 ensuring that the potential ($V_{28}$) at node 28 rises to within a $V_F$ drop of $V_2$ such that $V_{28}$ is equal to $V_2 - V_F$, where the $V_F$ of a forward biased diode is approximately equal to 0.5 volt.

With $V_2 - V_F$ applied to node 34 and ($V_2 - V_F$) applied to the gates of P1b and N1b, P1b is turned off and N1b is turned-on. Consequently, N1b clamps the output 30 of inverter I2 at, or close to, zero volts ($V_1$), and P2b is turned-on clamping node 28 to the potential ($V_{34}$) at terminal 34 which is also $V_2 - V_F$ volts. Since node 34 is at $V_2 - V_F$, the gate-to-source voltage ($V_{GS}$) of P1b is zero and P1b is definitely cut off. With P1b off, and with N1b and P2b turned-on, the output 30 is clamped to zero volts and latch 12 is in a stable state.

Assume now that P3 is turned-on when $V_C$ applied to its gate goes to zero volts. P3 conducts in the common source mode and clamps the 20 volts at terminal 36 to node 34. Diode D2 is then reversed biased into non-conduction. Transistor P2b with its source at, or close to, 20 volts and with its gate at zero volts is turned on very hard and clamps node 28 to 20 volts. P1b with its gate and source at 20 volts has zero $V_{GS}$ and remains off, while N1b with its gate at 20 volts and its source grounded is turned on harder maintaining the potential ($V_{30}$) at node 30 at ground potential and P2b turned on hard.

It remains to be shown that the gating network does not pass current from latch 12 into circuit 10 and blocks or isolates the $V_2$ source from the $V_3$ source. As $V_{28}$ rises above $V_2-V_F$ volts, following the application of $V_3$ to $V_{34}$, the electrode of N3 connected to node 28 functions as the drain of N3 and the electrode of N3 connected to node 22 functions as the source electrode. Since node 22 is at $V_2$ volts and since the gate of N3 is at $V_2$ volts, the $V_{GS}$ of N3 is equal to zero volts and N3 is turned off. Consequently, conduction through N3 is blocked while diode D1 is reverse biased. Hence, N3 functions to isolate input circuit 10 from the half latch circuit 12. It has, therefore, been shown that, when similar (or the same) operating voltages are applied to the input circuit and the latch, a logic "0" can be transferred from input circuit 10 to the output of latch 12 via gating means 14. Furthermore, when the voltage across the latch is increased it remains set to the state to which it was set, i.e. node 30 is set to logic "0", and the gating means passes no steady state current (except for leakage currents through N3 and diode D1, which are neglected).

Assume now that an input signal of $V_2$ volts, arbitrarily defined as logic "1", is applied to input terminal 20 and that $V_{34}$ is at $V_2-V_F$ volts (P3 is OFF). This turns-off P1a and turns-on N1a resulting in node 22 being clamped to ground potential via the drain-to-source path of N1a. N3 with its source (node 22) at, or close to, ground potential and its gate at $V_2$ volts conducts in the common source mode and clamps node 28 at, or close to ground potential. With $V_{28}$ at, or close to, ground N1b is turned-off while P1b is turned on clamping node 30 to the $V_2-V_F$ volts present at node 34. P2b is then turned off since its $V_{GS}$ is zero. The latch is set to logic "1" since node 30 is at $V_2-V_F$ volts and signals having a level approximately equal to or more positive than $V_2-V_F$ volts are defined, arbitrarily as representing the logic "1" level.

Assume now that P3 is turned-on and that $V_{34}$ rises from $V_2$ (5 volts) to $V_3$ (20 volts). P1b with its gate grounded via N3 and N1a is turned on very hard and continues to provide a low impedance path between terminal 34 and node 30 so $V_{30}$ rises to $V_3$ volts. N1b with its gate grounded via N3 and N1a remains cut off and P2b is also cut off since its $V_{GS}$ is at, or close to, zero volts. $V_{30}$ increases from $V_2-V_F$ volts to $V_3$ volts, but the latch remains in the logic "1" state. Signals having a level more positive than $V_2-V_F$ are defined as representing the logic "1" level. Therefore, when the latch is storing a logic "1", increasing the operating voltage across the latch increases the level of the voltage at node 30 but maintains the state of the latch.

With P2b cut-off no current flows from the $V_3$ potential into node 28 (except for leakage currents which can be neglected). N3 with its gate at $V_2(+5$ volts) is turned-on, but since its source and drain electrodes are at the same potential (i.e. zero volts) there is no steady state conduction along its conduction path. Therefore, once the capacitance at node 28 is discharged via the series connected conduction paths of N1a and N3 there is no steady state current (except for leakage) through N3.

It has been shown that a logic "1" can be transferred from the input 20 to output 30 when the latch 12 and the input circuit 10 are operated at similar (or the same) operating voltages. Furthermore, when the voltage across the latch is increased, the state (logic "1") to which the latch was set is maintained.

Maintaining the gate of N3 positively biased during and after data transfer ensures that N3 provides a low impedance conduction path between nodes 28 and 22 when N1a is turned-on. Therefore, node 28 is prevented from rising in potential by N3 and N1a and there is no need for latch 12 to be a full latch. That is, a transistor N2b of the type shown in FIG. 2 is not necessary for the proper operation of the circuit of FIG. 1. Therefore, a significant advantage of biasing the gate of N3 to $V_2$ volts is that it eliminates the need to make circuit 12 a full latch. However, in a circuit where N3 would be turned-off (e.g. by means returning its gate to ground potential) following data transfer, latch 12 would have to be made a full latch (bistable circuit) to ensure proper operation of the circuit when storing the logic "1" level. A transistor N2b as shown in FIG. 2 would then be used with its source-to-drain path connected between nodes 28 and 32 and with its gate connected to node 30.

The input circuit 10 has been shown as a complementary inverter but it should be evident that any signal source producing signals varying in amplitude between $V_1$ and $V_2$ volts could be used instead. Also, the half-latch circuit 12 has many desirable features, but any suitable latch circuit whose operating potential can be switched could be used instead.

In the circuit of FIG. 3 input signals varying between ground ($V_{1A}$) and $-5$ volts ($V_{2A}$) are level shifted and made to vary between ground and $-20$ volts ($V_{3A}$). The input signals are applied to an input circuit 10a comprising inverter I1A operated between ground and $-5$ volts. The output of inverter I1A is coupled via a gating transistor P5A to the input node 28a of a full latch 12a. A diode poled to conduct current from node 28a into the output of I1A could be used, if desired, to provide a parallel path with the conduction channel of P5A. A source $V_{TR}$ which produces signals varying in amplitude between $V_{1A}$ and $V_{2A}$ is connected to the gate of P5A. When $V_{1A}$ volts are applied to its gate P5A is cut off and data transfer between I1A and I2A cannot take place. When $V_{2A}$ volts are applied to its gate, P5A is turned-on and data transfer can take place between circuits 10a and 12a. Latch 12a includes cross-coupled inverters I2A and I4A whose positive power terminal 34a is grounded and whose negative power terminal 32a has either $-5$ volts ($V_{2A}$) applied to it or $-20$ volts ($V_{3A}$) applied to it. N5A connected between terminal 32a and a $-5$ volts ($V_{2A}$) potential point, clamps node 32a to $-5$ volts when turned on. An IGFET N6A connected between terminal 32a and a $-20$ volt ($V_{3A}$) potential point clamps node 32a to $-20$ volts when turned on. N5A is turned on by a control signal $V_{C1}$ applied to its gate and N6A is turned on by a control signal $V_{C2}$ applied to its gate. As shown in the accompanying waveform diagrams $V_{C1}$ varies between ground and $-5$ volts and $V_{C2}$ varies between ground and $-20$ volts. N5A is turned on and N6A is turned off when it is desired to transfer data between input circuit 10a and latch 12a. Following data transfer, N5A is turned off, and N6A is turned on to cause a shift in the level of the signal stored by the latch.

As in the circuit of FIG. 1, latch 12a may be a half latch including only feedback IGFET N4A if P5A is turned-on and kept on following the application of the high voltage ($-20$ v). If P5A is turned-off following data transfer then latch 12a must be a full latch (e.g. be bistable) as shown.

The operation of the circuit of FIG. 3 is similar, but complementary, to that of FIG. 1 and need not be detailed. For P5A and N5A turned on, an input signal of $V_{1A}$ volts or $V_{2A}$ volts applied to the input of I1A causes a like amplitude and polarity signal to be produced at the output 30a. Following the turn-off of N5A and the turn-on of N6A, the voltage at terminal 32a is −20 volts. A voltage of $V_{1A}$ volts, arbitrarily defined as logic "0", present at node 30a prior to the turn-on of N6A will remain at $V_{1A}$ volts. A voltage of $V_{2A}$ volts, arbitrarily defined as logic "1", present at node 30a prior to the turn on of N6A will be increased to $V_{3A}$ (−20 volts) after the turn on of N6A. But, any signal which is more negative than approximately −5 volts is defined as logic "1". Hence, as before, the logic significance (logic "1") of the voltage level after N6A is turned on, is identical to the prior condition, and hence the latch remains set to its prior condition (logic "1").

Figure 4:
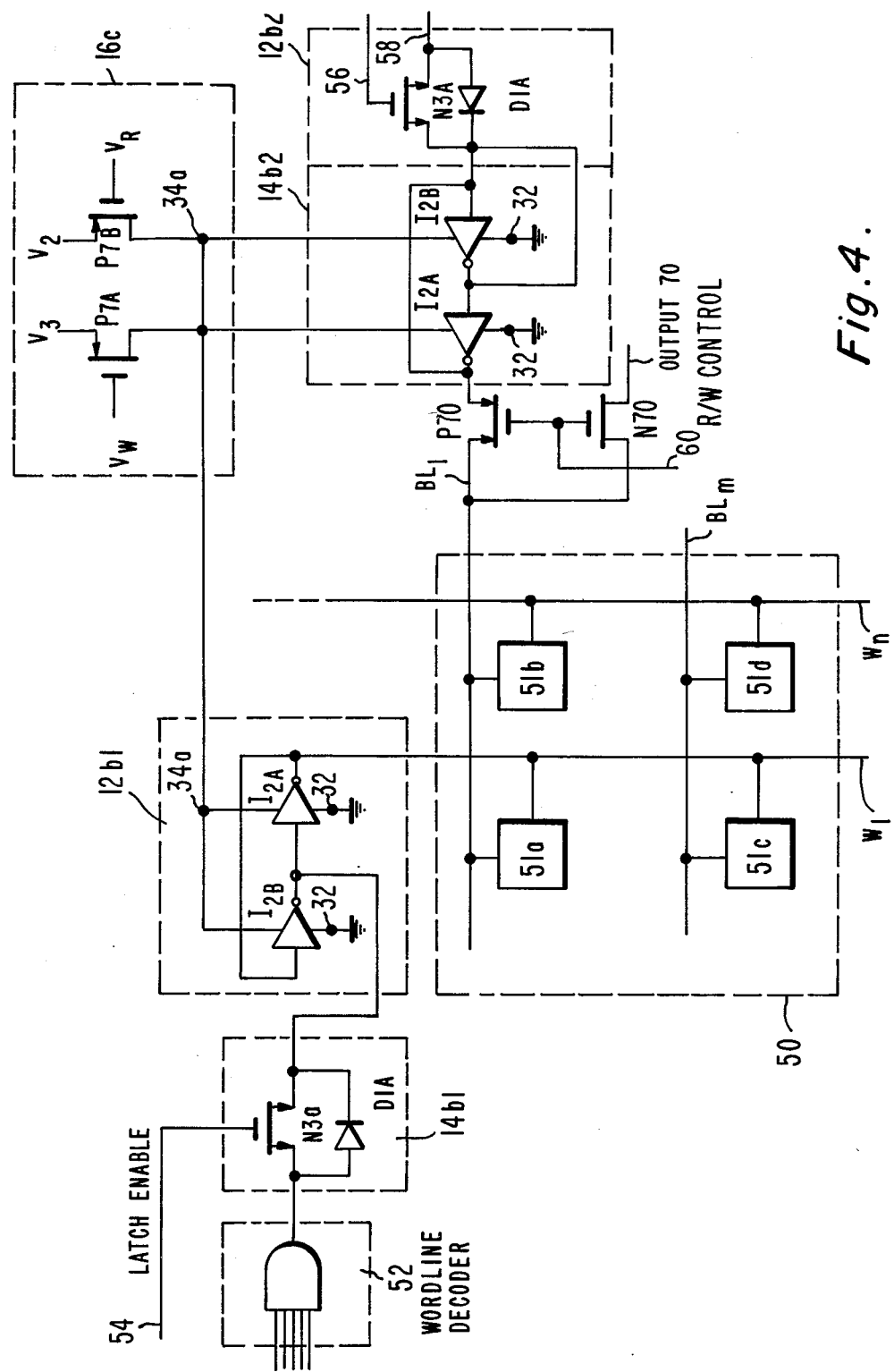
FIG. 4 is a partial schematic, partial block diagram of a memory array embodying the invention.

FIG. 4 shows a memory array 50 of cells 51 which require high voltage signals (e.g. 20 volts) for the write and erase operations. The cells include at least one device (e.g. floating gate transistor. MNOS transistor or the like) which can store information. Operating the decoding, control and sensing circuitry at the same high voltage as the memory would impose severe restrictions on the layout, processing techniques, and sizes of the semiconductor devices of these circuits. The result would be the consumption of much chip area. Further, if the voltage to the array is decreased during the read operation, which normally requires a much lower potential than the write operation, the circuitry designed to operate at a much higher potential responds slowly. The level shift circuit of the invention enables the memory design to be such that only the memory array 50 and the circuits writing information into the array need be designed to handle high voltage signals. All other circuits including the control logic, decoders, and sense amplifiers are always operated at low voltage levels (e.g. 5 volts). This also provides compatibility with standard 5 volts logic levels used by conventional circuits.

High voltage levels (e.g. 0 to 20 volts) required to be applied to the word lines (e.g. W1) and to the bit lines (e.g. BL1) are generated by means of latch circuits (e.g. 12b1, 12b2) and gating means (e.g. 14b1, 14b2). Each gating means includes an N-channel isolation transistor and a diode D1A as in FIG. 1. Each latch includes two cross-coupled inverters (I2A, I2B) connected between ground and a positive terminal 34a. A transistor P7B when turned on by a $V_R$ signal on its gate clamps terminal 34a to $V_2$ volts, and, at different times, a transistor P7A when turned-on by a $V_W$ signal on its gate clamp terminal 34a to $V_3$ volts.

The output of level shift circuit 14b2 is coupled to bit line BL1 via switching transistor P70 while the contents of the memory cell are read out via switching transistor N70 connected to BL1. The turn-on and turn-off of P70 and N70 is controlled by a read write (R/W) control signal applied to the gates of P70 and N70.

The decoder 52 is powered by the $V_2$ volts supply and the signals applied to the input of the decoder, to latch enable lines 54 and 56, to a data input line 58, and to the gate of P7B, are generated by circuits powered by the intermediate, $V_2$, supply. At the start of a write cycle, during data transfer, and during the read cycle of the memory, the latch enable signals on 54 and 56 are at $V_2$ volts and the latches are powered by the $V_2$ volts power supply ($V_R$ is at $V_1$ and $V_W$ is at $V_3$). If the signals on lines 54 and 56 are held at $V_2$ during data transfer and after the ensuing write operation, then latches 12b1 and 12b2 can be half latches as discussed earlier. Following data transfer when the latches are loaded with the information to be written in memory, and after the address inputs have stabilized, the voltage on line 34a is raised to the writing level of 20 volts by turning on P7A ($V_W$ goes to zero, $V_R$ is at $V_2$ volts). If a logic "1" had been stored in a latch the latch output is raised to 20 volts, if the latch had stored a "0" the latch ouput remains at ground. The write or erase cycle is terminated when P7A is turned off and $V_2$ volts is reapplied to the latches. In addition to the components comprising the latch, only the components (N3A and D1A) comprising the gating means and those (P70, N70) coupled to the bit lines need be designed to handle the high voltage ($V_3$).

In memory arrays embodying the invention precious area is saved in the design of the decoders (e.g. 52). This is important since the decoders usually limit the "pitch" (center to center spacing between word lines or bit lines) and density possible in memory array. The slow speed problem encountered when reading at 5 volts with decoders designed for write operation at 20 volts is avoided.

What is claimed is:

1. A level shift circuit comprising:
an input point at which are generated data signals varying in amplitude between a first voltage level and a second voltage level;
a latch circuit having at least one stable state;
a gating transistor having a conduction path and a control electrode, the conduction path of said transistor being connected between said input point and said latch circuit, and means for applying a turn on potential to said control electrode for transferring data between said input point and said latch for setting said latch to a condition representative of the value of the input signal;
means for applying a first operating potential across said latch circuit of similar value to the dirrerence in the potential between the levels of said data signals, during the time data signals are transferred to said latch circuit; and
means for applying a second operating potential, greater than said first operating potential, across said latch circuit following the transfer of data to said latch circuit.

2. The combination comprising:
first, second and third power terminals for the application thereto of first, second, and third different operating voltages, respectively;
an input stage for receiving input signals making transitions between a first level, corresponding to said first voltage, and a second level, and having an output terminal which is clamped to said first voltage for one input signal condition and which is clamped to said second voltage for another input signal condition;
an inverter having an input node, an output node, and first and second voltage terminals; means direct current connecting said first voltage terminal to said first power terminal;
first and second power coupling means connected between said second voltage terminal and said second and third power terminals, respectively, for selectively applying to said second voltage terminal one or the other of said second and third operating voltages;

a gating means including a gating transistor having a conduction path and a control electrode; said conduction path being connected between said output terminal and said input node, and said control electrode being connected to a point of potential having a polarity and magnitude to turn-on said transistor; and a regenerative feedback means connected to said input node of said inverter, responsive to the signal at said output node, for driving said input node to the voltage at said second voltage terminal and setting the voltage at said output node to the voltage at said first voltage terminal in response to the application to said input node of a potential going from said first voltage to a value approximately equal to that of said second voltage, 3. The combination as claimed in claim 2 wherein said gating transistor is an insulated-gate field-effect transistor (IGFET) having source and drain electrodes and a gate electrode; wherein the ends of said conduction path of said gating transistor are defined by the source and drain electrodes of said IGFET; and wherein said control electrode is the gate electrode of said IGFET, and wherein said point of potential is said second power terminal.

4. The combination as claimed in claim 3 wherein said gating transistor conducts in the source follower mode for one value of signal and conducts in the common source mode for another value of signal; and wherein said gating means also includes a diode connected between said output terminal and said input node poled to conduct current for the condition when said gating transistor tends to conduct in the source follower mode.

5. The combination as claimed in claim 4 wherein said regenerative feedback means includes an IGFET connected at its gate electrode to said output of said inverter and having its source-to-drain path connected between said input node of said inverter and said second power terminal.

6. The combination as claimed in claim 5 wherein said gating transistor is of one conductivity type and wherein said regenerative feedback transistor is of complementary conductivity type.

7. The combination as claimed in claim 6 wherein said inverter is comprised of a pair of IGFETs of complementary conductivity type.

8. The combination as claimed in claim 2 wherein said first power coupling means is a diode poled to couple the voltage at said second power terminal to said second voltage terminal of said inverter, and wherein said second power coupling means is an insulated-gate field-effect transistor (IGFET) having its source-drain path connected between said third power terminal and said second voltage terminal of said inverter, and being responsive to a control voltage at its gate electrode for selectively applying the voltage at said third power terminal to said second voltage terminal and reverse biasing said diode.

9. The combination as claimed in claim 2 wherein said first and second power coupling means are first and second insulated-gate field-effect transistors (IGFETs); said first IGFET having its conduction path connected between said second voltage terminal and said second power terminal; said second IGFET having its conduction path connected between said second voltage terminal and said third power terminal; and including means for applying turn-on signals to the gates of said first and second IGEFTs selectively turning-on one or the other of them.

10. A level shift circuit comprising:

first, second, and third power terminals for the application thereto of first, second, and third operating voltages, respectively; said second voltage having a value intermediate the values of said first and third voltages;

a data input signal responsive stage connected between said first and second power terminal having an output terminal which is clamped to said first power terminal for one data input condition and which is clamped to said second power terminal for another data input condition, an inverter having an input node, an output node and first and second terminals for the application therebetween of an operating potential;

a positive feedback means connected to the inverter input node responsive to at least one condition of the inverter output;

means for applying the voltage at said first and second power terminals to said first and second terminals of said inverter, respectively, during a first time interval;

gating means including a transistor having a conduction path and a control electrode; means connecting the conduction path of said transistor between said output terminal and said input node, and means applying a turn-on potential to the control electrode of said transistor, at least during said first time interval, for transferring data between said input stage and said inverter during said first time interval; and means for applying the voltage at said first and third power terminals to said first and second terminals of said inverter, respectively, during a second time interval, subsequent to said first time interval.

* * * * *